United States Patent [19]
Kato et al.

[11] Patent Number: 5,256,927
[45] Date of Patent: Oct. 26, 1993

[54] SURFACE ACOUSTIC WAVE ELEMENT HAVING A WIDE BANDWIDTH AND A LOW INSERTION LOSS

[75] Inventors: Shunji Kato, Ageo; Kazuhiko Yamanouchi, 37-13, Matsugaoka, Taihaku-ku, Sendai-shi, Miyagi-ken; Junichi Ogata, Sendai, all of Japan

[73] Assignees: Mitsui Mining & Smelting Co., Ltd., Tokyo; Kazuhiko Yamanouchi, Miyagi, both of Japan

[21] Appl. No.: 858,333

[22] Filed: Mar. 26, 1992

[30] Foreign Application Priority Data

Mar. 29, 1991 [JP] Japan .................. 3-091180

[51] Int. Cl.5 ......................................... H01L 41/08
[52] U.S. Cl. .......................... 310/313 B; 310/313 R
[58] Field of Search ........... 310/313 R, 313 B, 313 C; 333/150, 195

[56] References Cited

U.S. PATENT DOCUMENTS

| | | | |
|---|---|---|---|
| 3,376,572 | 4/1968 | Mayo | 310/313 B |
| 3,675,163 | 7/1972 | Hartmann et al. | 333/195 |
| 3,882,433 | 5/1975 | Subramanian | 333/150 |
| 4,342,011 | 7/1982 | Iwamoto et al. | 333/195 |
| 4,387,355 | 6/1983 | Uno et al. | 333/195 |
| 4,456,847 | 6/1984 | Minagawa et al. | 310/313 R |
| 4,473,888 | 9/1984 | Smith | 310/313 B |
| 4,701,657 | 10/1987 | Grassl | 310/313 C |
| 4,918,349 | 3/1990 | Shiba et al. | 310/313 C |

Primary Examiner—Steven L. Stephan
Assistant Examiner—Thomas M. Dougherty
Attorney, Agent, or Firm—Bucknam and Archer

[57] ABSTRACT

A surface acoustic wave element has a low insertion loss in one direction and a wide band width. This surface acoustic wave element has first and second interdigital electrodes each having a thickness on a piezoelectric or electrostrictive substrate. In a first interdigital electrode for exciting a surface acoustic wave, positive and negative electrodes are alternately arranged such that their electrode widths and periods are gradually decreased in a direction of propagation of the surface acoustic wave. In a second interdigital electrode for receiving the surface acoustic wave, positive and negative electrodes are alternately arranged such that their electrode widths and periods are gradually increased or decreased in the direction of propagation of the surface acoustic wave.

19 Claims, 9 Drawing Sheets

DOWN CHIRP + DOWN CHIRP

UP CHIRP + UP CHIRP

DOWN CHIRP + IDT

UP CHIRP + IDT

DOWN CHIRP + IDT

UP CHIRP + IDT

SURFACE ACOUSTIC WAVE ELEMENT HAVING A WIDE BANDWIDTH AND A LOW INSERTION LOSS

BACKGROUND OF THE INVENTION

1. Field of the Invention

The present invention relates to a surface acoustic wave element in which surface acoustic wave transducers respectively provided with interdigital electrodes having different electrode widths and periods in a direction of propagation of a surface acoustic wave are combined, and a filter using such a surface acoustic wave element.

2. Description of the Prior Art

Conventionally, in a general surface acoustic wave transducer having an interdigital electrode structure comprising positive and negative electrodes provided on a piezoelectric substrate (including a piezoelectric thin film substrate), the positive and negative electrodes are arranged at equal periods. FIG. 4(a) is a plan view showing a filter using conventional surface acoustic wave transducers, and FIG. 4(b) is a sectional view taken along the line X-Y of FIG. 4(a). An excitation-side surface acoustic wave transducer 41 transduces an electrical signal to a surface acoustic wave, and a reception-side surface acoustic wave transducer 42 detects the surface acoustic wave generated by the surface acoustic wave transducer 41 and propagating along an arrow A and transduces it to an electrical signal. In an interdigital electrode structure of each of the surface acoustic wave transducers 41 and 42, electrodes are arranged at equal periods. That is, p is constant and m/p is a constant (usually "0.5") where m is the electrode width and p is the period.

In the surface acoustic wave transducer having electrodes arranged at equal periods, a generated surface acoustic wave propagates to the right and left with substantially the same amplitude. Thus, this surface acoustic wave transducer has similar insertion loss characteristics in the two directions, i.e., the bi-directional characteristics.

Conventional techniques for obtaining a uni-directional surface acoustic wave transducer having a low insertion loss only in one direction by using a surface acoustic wave transducer in which electrodes are arranged at equal periods include a method of using a 120°-phase shifter, a method of using a 90°-phase shifter, and a method of using an internal reflection type uni-directional transducer for obtaining uni-directional characteristics by asymmetrically arranging reflecting electrodes between positive and negative electrodes at equal periods.

An example of a surface acoustic wave transducer is a dispersion type delay line (chirp filter). FIG. 5 is a plan view showing an arrangement of a conventional dispersion type delay line. An excitation-side surface acoustic wave transducer 51 transduces an electrical signal to a surface acoustic wave, and a reception-side surface acoustic wave transducer 52 detects the surface acoustic wave generated by the surface acoustic wave transducer 51 and propagating along an arrow B and transduces it to an electrical signal. In the interdigital electrode structure of the surface acoustic wave transducer 52, positive and negative electrodes 53 and 54 are alternately arranged such that their periods are gradually decreased in a direction B of propagation of the surface acoustic wave that is the positive and negative electrodes 53 and 54 have a graded periodicity. Characteristics in which the delay time changes in proportion to a frequency can be obtained by arranging the positive and negative electrodes in this manner.

A surface acoustic wave transducer in which electrodes are arranged at equal periods has bi-directional characteristics and cannot obtain a low uni-directional insertion loss. With the above technique of obtaining the uni-directional surface acoustic wave transducer, although a low uni-directional insertion loss can be obtained, since the surface acoustic wave transducer having electrodes arranged at equal periods is used, wide-band characteristics cannot be obtained.

According to the dispersion type delay line as shown in FIG. 5, the delay time of a signal having a high frequency is long, and the delay time of a signal having a low frequency is short, thus constituting a up-chirp delay line. A down-chirp delay line having opposite characteristics can also be obtained. In this case, however, since a conventional dispersion type transducer, i.e., a transducer having bi-directional characteristics is used, a transducer having a low insertion loss cannot be obtained.

SUMMARY OF THE INVENTION

The present invention has been made in view of the problems of the conventional surface acoustic wave element described above, and has as its object to provide a surface acoustic wave element having a low uni-directional insertion loss and wide-band characteristics.

In order to achieve the above object, according to the present invention, there is provided a surface acoustic wave element in which a first surface acoustic wave transducer for exciting a surface acoustic wave and a second surface acoustic wave transducer for receiving the surface acoustic wave are provided on a piezoelectric or electrostrictive substrate so that those transducers are opposed to each other in the propagation direction of the surface acoustic wave, at least one of said surface acoustic wave transducers having a uni-directivity and wherein a propagation loss suffered when a surface acoustic wave propagates in a direction through a transducer is larger than a loss suffered when the wave propagates in the opposite direction. A surface acoustic wave element in which interdigital electrodes each having a thickness are provided on a piezoelectric or electrostrictive substrate, comprising a first interdigital electrode, obtained by alternately arranging positive and negative electrodes such that an electrode width and a period thereof are gradually decreased in a direction of propagation of a surface acoustic wave, for exciting the surface acoustic wave, and a second interdigital electrode, obtained by alternately arranging positive and negative electrodes such that an electrode width and a period thereof are gradually increased in the direction of propagation of the surface acoustic wave, for receiving the surface acoustic wave.

In a second aspect of the present invention, there is also provided a surface acoustic wave element in which interdigital electrodes each having a thickness are provided on a piezoelectric or electrostrictive substrate, comprising a first interdigital electrode, obtained by alternately arranging positive and negative electrodes such that an electrode width and a period thereof are gradually decreased in a direction of propagation of a surface acoustic wave, for exciting the surface acoustic wave, and a second interdigital electrode, obtained by alternately arranging positive and negative electrodes such that an electrode width and a period thereof are gradually decreased in the direction of propagation of the surface acoustic wave, for receiving the surface acoustic wave.

It is preferable that the first interdigital electrode satisfies $0.2 \leq m/p \leq 0.7$ and the second interdigital electrode satisfies $0.72 \leq m/p \leq 0.9$ where m is the electrode width and p is the period of the interdigital electrodes.

The surface acoustic wave element in which $Zm/Zg$ of the first interdigital electrode is smaller than 1 and $Zm/Zg$ of the second interdigital electrode is larger than 1 where Zm is the acoustic impedance of a metal film of an interdigital electrode and Zg is the acoustic impedance of an electrode gap can be used as a filter.

When positive and negative electrodes having a graded periodicity are arranged in the direction of propagation and when the film thickness of each electrode is large, the phase of excitation and the phase of reflection by the electrode can be the same in one direction of propagation and opposite to each other in the other direction of propagation. When surface acoustic wave transducers of this type having uni-directional characteristics are arranged such that their graded directions oppose each other, a surface acoustic wave element (filter) having different delay times depending on frequencies can be obtained.

When the graded direction of the excitation- and reception-side surface acoustic wave transducers are aligned in the same direction, a surface acoustic wave element (filter) having a constant delay time with respect to frequencies can be obtained. In particular, in the above arrangement, if the first and second interdigital electrodes are set to satisfy $0.2 \leq m/p \leq 0.7$ and $0.72 \leq m/p \leq 0.9$, respectively, the second electrode has substantially bi-directional characteristics, and a filter having a low insertion loss can be obtained.

DETAILED DESCRIPTION OF THE PREFERRED EMBODIMENT

Figure 1:
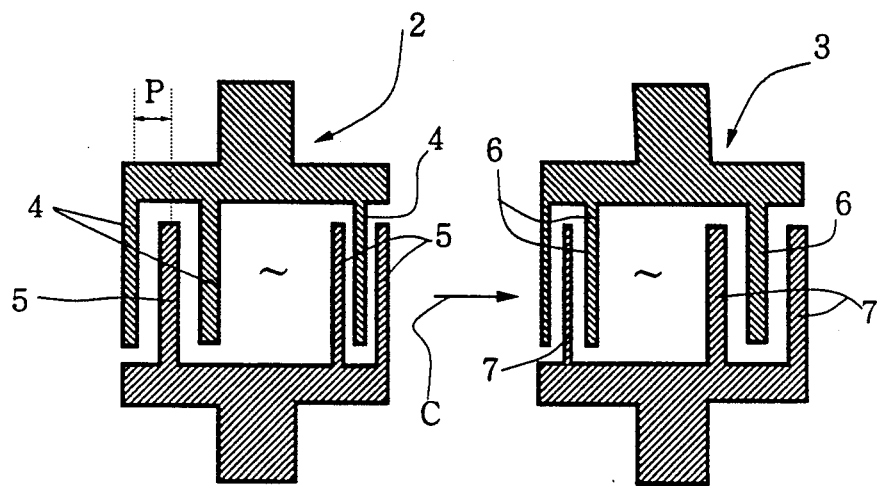
FIGS. 1(a) and 1(b) are plan and sectional views, respectively, of a filter as a surface acoustic wave element according to an embodiment of the present invention.
Figure 1:
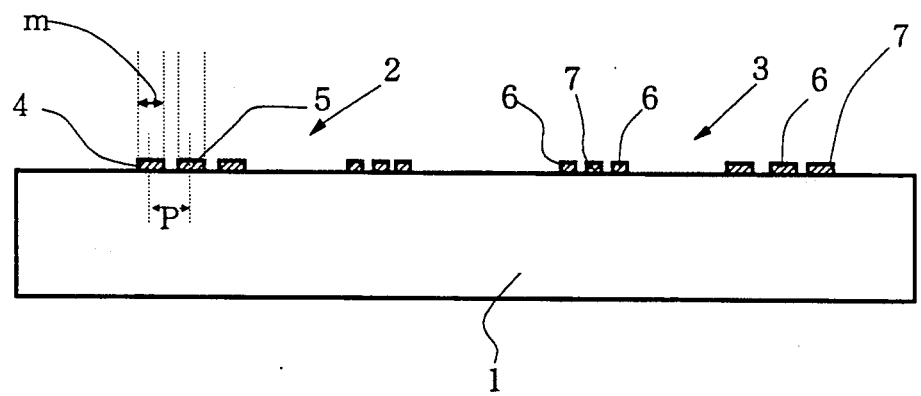

The preferred embodiment of the present invention will be described with reference to the accompanying drawings.

FIG. 1(a) is a plan view of a filter as a surface acoustic wave element according to an embodiment of the present invention, and FIG. 1(b) is a sectional view taken along the line X-Y of FIG. 1(a). Referring to FIGS. 1(a) and 1(b), reference numeral 1 denotes a piezoelectric substrate; 2, an excitation-side surface acoustic wave transducer arranged on the piezoelectric substrate 1; and 3, a reception-side surface acoustic wave transducer arranged on the piezoelectric substrate 1. The excitation-side surface acoustic wave transducer 2 has positive and negative electrodes 4 and 5 (first interdigital electrode). The reception-side surface acoustic wave transducer 3 has positive and negative electrodes 6 and 7 (second interdigital electrode). The excitation-side positive and negative electrodes 4 and 5 are alternately arranged such that their electrode width m and period p are gradually decreased in a direction C of propagation of the surface acoustic wave. Inversely, the reception-side positive and negative electrodes 6 and 7 are alternately arranged such that their electrode width m and period p are gradually increased in the direction C of propagation of the surface acoustic wave. In this case, lithium niobate of Y-cut-Z-propagation was used as the piezoelectric substrate 1, and aluminum films were used as the electrodes 4, 5, 6, and 7. A relationship $m/p=0.5$ was set.

Figure 3:
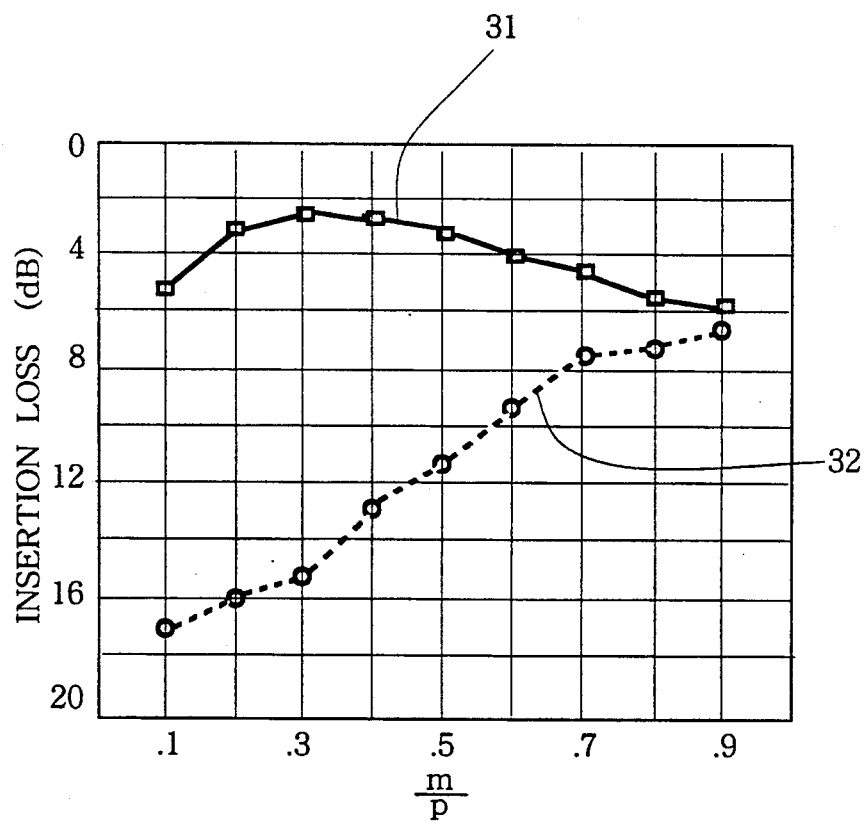
FIG. 3 is a graph showing the relationship between m/p and an insertion loss.
Figure 4:
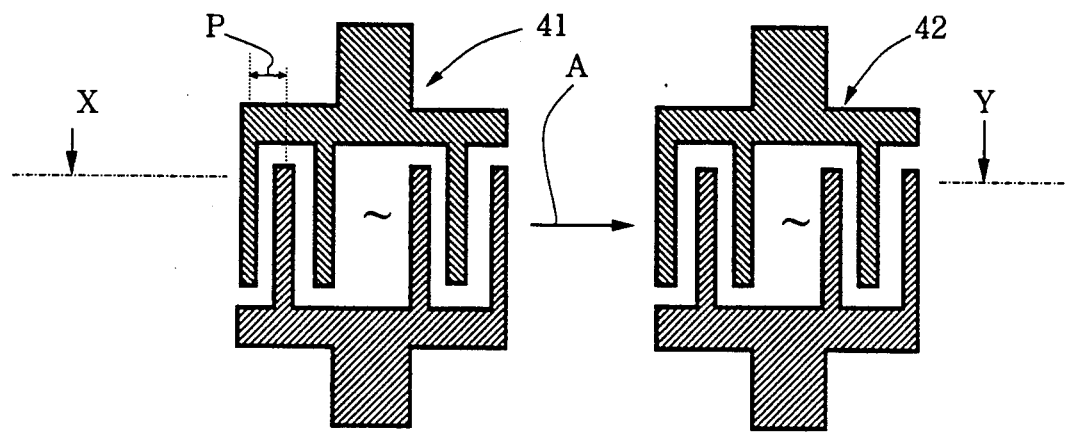
FIGS. 4(a) and 4(b) are plan and sectional views, respectively, of a filter using conventional surface acoustic wave transducers.
Figure 4:
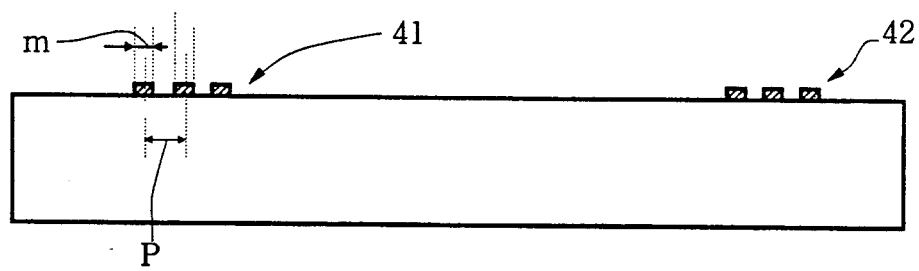
Figure 5:
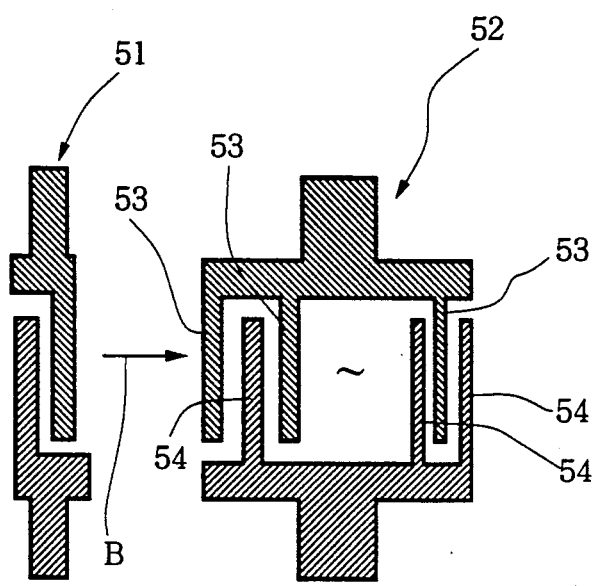
FIG. 5 is a plan view showing the structure of a conventional dispersion type delay line.

The curve 31 of FIG. 3 shows the relationship between m/p and an insertion loss of the filter shown in FIG. 1. In the filter of FIG. 1, since the excitation- and reception-side electrodes are arranged to be symmetrical to each other, the curve 31 indicates the insertion loss characteristics of the surface acoustic wave transducers in the forward direction (a direction to obtain a surface acoustic wave having a large amplitude). Inversely, the curve 32 indicates the relationship between m/p and the insertion loss of a filter in which the backward directions (directions to obtain a surface acoustic wave having a small amplitude) of the surface acoustic wave transducers are arranged to oppose each other. Thus, the curve 32 indicates the insertion loss characteristics of the surface acoustic wave transducers in the backward direction. It is apparent from FIG. 3 that the insertion loss in the backward direction is higher than the insertion loss in the forward direction, and that the magnitude of insertion loss differs depending on m/p. Note that the forward direction may be inverted depending on the types of cutting and propagation of piezoelectric crystal, and the types of deposition films.

A filter having a band width of 20% or more and an insertion loss of 5 dB or less can be obtained by the arrangement of FIG. 1. In the case of FIG. 1, m/p is preferably about 0.2 to 0.7.

Figure 2:
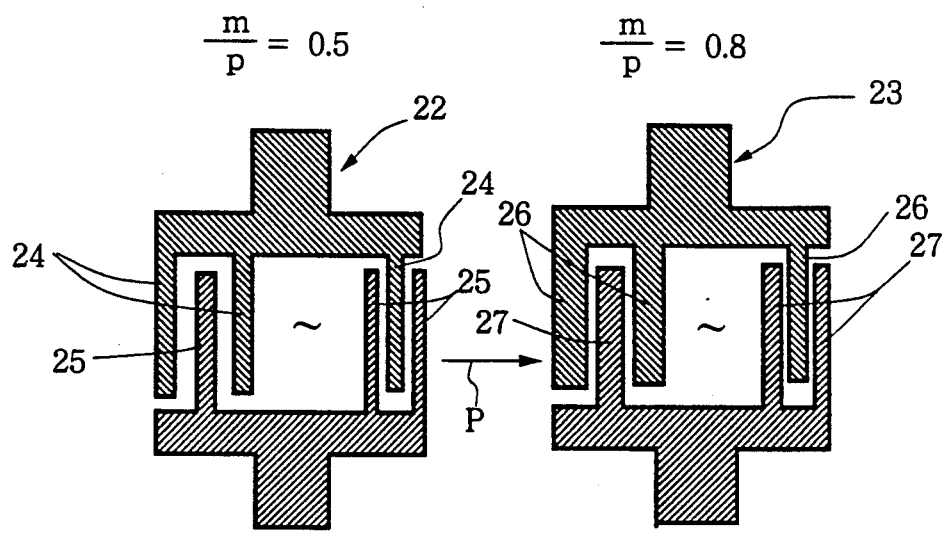
FIG. 2 is a plan view of a filter in which the excitation- and reception-side directivities are aligned in the same direction.

FIG. 1 shows a filter whose delay time differs depending on the frequencies. In order to obtain a filter having a constant delay time with respect to frequencies, the directivities of the excitation- and reception-side transducers may be aligned in the same direction, as shown in FIG. 2. Referring to FIG. 2, reference numeral 22 denotes an excitation-side surface acoustic wave transducer arranged on a piezoelectric substrate; and 23, a reception-side surface acoustic wave transducer arranged on the piezoelectric substrate. The excitation-side surface acoustic wave transducer 22 has positive and negative electrodes 24 and 25 (first interdigital electrode). The reception-side surface acoustic wave transducer has positive and negative electrodes 26 and 27 (second interdigital electrode). The excitation-side positive and negative electrodes 24 and 25 are alternately arranged such that the electrode width m and the period p are gradually decreased in a direction D of propagation of the surface acoustic wave. Similarly, the reception-side positive and negative electrodes 26 and 27 are alternately arranged such that the electrode width m and the period p are gradually decreased in the direction D of propagation of the surface acoustic wave.

When the electrodes are arranged in this manner, a filter having a constant delay time with respect to frequencies can be obtained.

In this case, it is preferable that one of the excitation- and reception-side surface acoustic wave transducers uses a transducer having an intense directivity, and that the other of them uses a transducer having a weak directivity, i.e., substantially bi-directional transducer. Hence, from FIG. 3, it is preferable that one surface acoustic wave transducer is set to satisfy $0.2 \leq m/p \leq 0.7$, and the other surface acoustic wave transducer is set to satisfy $0.72 \leq m/p \leq 0.9$. In the filter of FIG. 2, the excitation-side positive and negative electrodes 24 and 25 are set to satisfy $m/p = 0.5$, and the reception-side positive and negative electrodes 26 and 27 are set to satisfy $m/p = 0.8$. Thus, a filter having a constant delay time with respect to frequencies, a wide band width, and a low insertion loss can be obtained.

The present inventors have been able to impart directivity to a surface acoustic wave transducer by positively utilizing reflection between electrodes placed on a piezoelectric substrate, and have constituted a surface acoustic wave element having a wide band width and a low insertion loss by utilizing the directivity of the surface acoustic wave transducer. In this case, each electrode need to have a certain thickness so that it reflects a surface acoustic wave. It is preferable to set the thickness of the electrode to satisfy $0.01 \leq H/\lambda \leq 0.10$ where H is the thickness of the electrode and $\lambda$ is the wavelength of the surface acoustic wave.

The directivity of a surface acoustic wave is determined in accordance with Zm/Zg where Zm is the acoustic impedance of an electrode metal and Zg is the acoustic impedance of the electrode gap.

Figure 7:
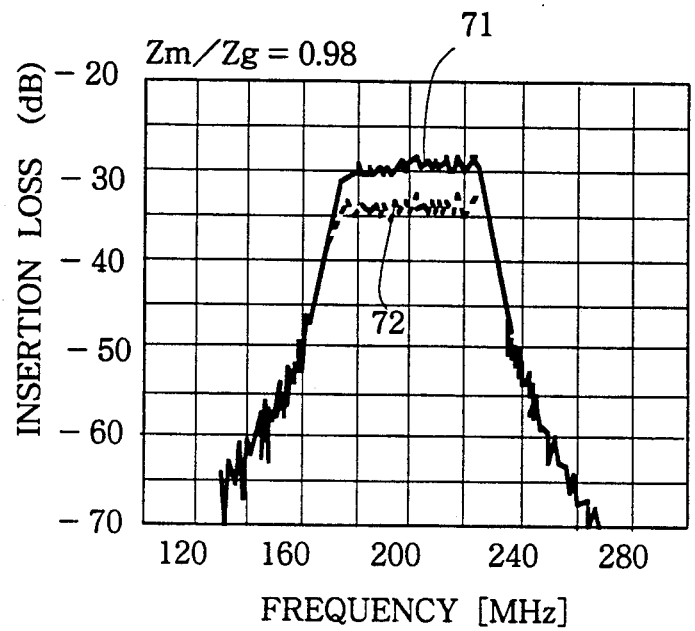
FIG. 7(a) shows the frequency characteristics of a chirp transducer satisfying $Zm/Zg=0.98$ for explaining the directivity thereof.
FIGS. 7(b) and 7(c) show the arrangements of the electrodes thereof.
Figure 7:
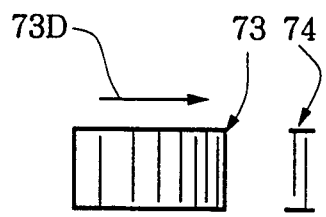
Figure 7:
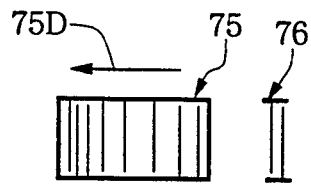

FIG. 7(a) shows the frequency characteristics of a chirp transducer for explaining the directivity thereof by way of analysis of an equivalent circuit when the thickness of each aluminum electrode is set to 2,000 angstrom and $Zm/Zg = 0.98$, and FIGS. 7(b) and 7(c) show the arrangements of the electrodes thereof. When a down-chirp IDT (interdigital transducer) 73 is placed adjacent to an IDT 74 having a pair of positive and negative electrodes such that the density of the positive and negative electrodes of the IDT 73 is gradually increased toward the IDT 74, as shown in FIG. 7(b), the frequency characteristic curve becomes as indicated by a solid line 71 in FIG. 7(a). Inversely, when an up-chirp IDT 75 is placed adjacent to an IDT 76 having a pair of positive and negative electrodes such that the density of the positive and negative electrodes of the IDT 75 is gradually increased toward the IDT 76, as shown in FIG. 7(c), the frequency characteristic curve becomes as indicated by a broken line 72 in FIG. 7(a). The frequency characteristics indicated by the solid line 71 are better than those indicated by the broken line 72. Thus, it is apparent that the IDT 73 has directivity indicated by an arrow 73D and the IDT 75 has directivity indicated by an arrow 75D.

Figure 8:
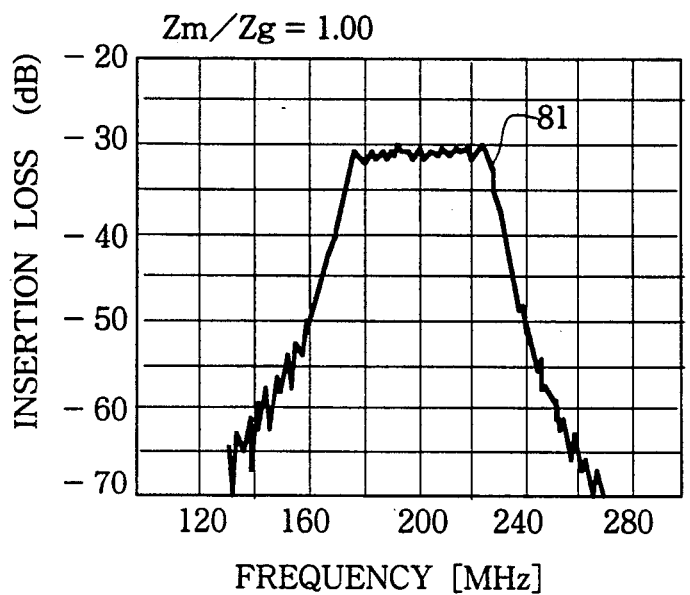
FIG. 8(a) shows the frequency characteristics of a chirp transducer of $Zm/Zg=1.00$ for explaining the directivity thereof.
FIGS. 8(b) and 8(c) show the arrangements of the electrodes thereof.
Figure 8:
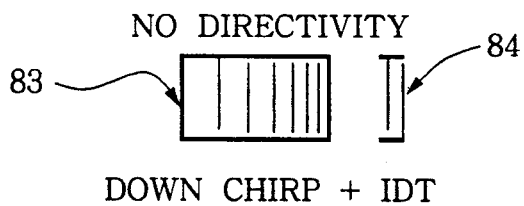
Figure 8:
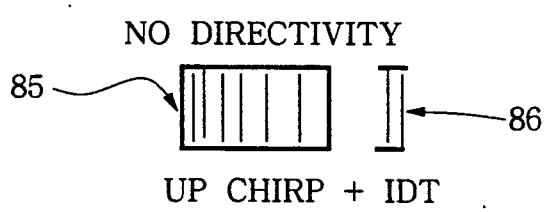

FIG. 8(a) shows the frequency characteristics of a chirp transducer for explaining the directivity thereof by way of analysis of an equivalent circuit when $Zm/Zg = 1.00$, and FIGS. 8(b) and 8(c) show the arrangements of the electrodes thereof. When a down-chirp IDT 83 is placed adjacent to an IDT 84 having a pair of positive and negative electrodes such that the density of the positive and negative electrodes of the IDT 83 is gradually increased toward the IDT 84, as shown in FIG. 8(b), the frequency characteristic curve becomes as indicated by a solid line 81 in FIG. 8(a). Similarly, when an up-chirp IDT 85 is placed adjacent to an IDT 86 having a pair of positive and negative electrodes such that the density of the positive and negative electrodes of the IDT 85 is gradually increased toward the IDT 86, as shown in FIG. 8(c), the frequency characteristic curve also becomes as indicated by the solid line 81 in FIG. 8(a). Thus, it is apparent that each of the IDTs 83 and 85 does not have directivity.

Figure 9:
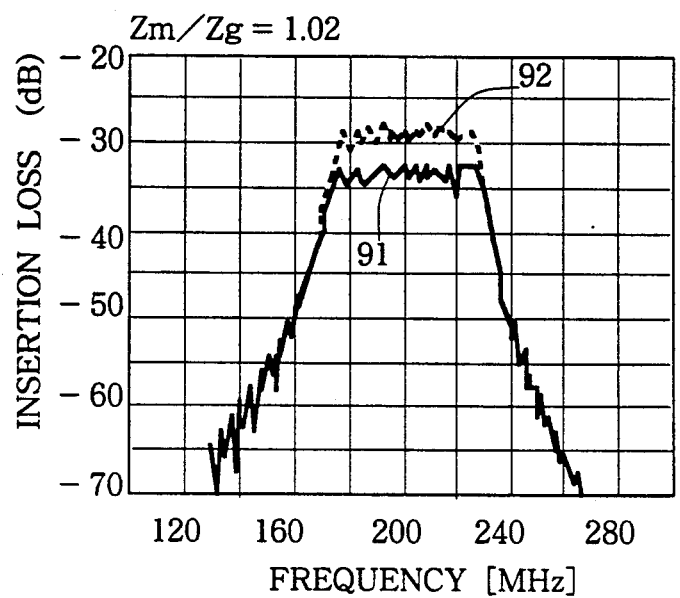
FIG. 9(a) shows the frequency characteristics of a chirp transducer of $Zm/Zg=1.02$ for explaining the directivity thereof.
FIGS. 9(b) and 9(c) show the arrangements of the electrodes thereof.
Figure 9:
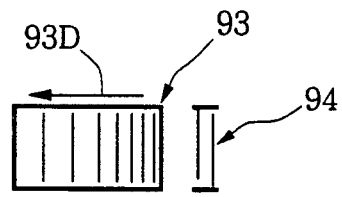
Figure 9:
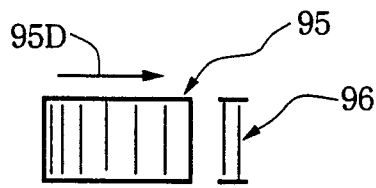

FIG. 9(a) shows the frequency characteristics of a chirp transducer for explaining the directivity thereof by way of analysis of an equivalent circuit when $Zm/Zg = 1.02$, and FIGS. 9(b) and 9(c) show the arrangements of the electrodes thereof. When a down-chirp IDT 93 is placed adjacent to an IDT 94 having a pair of positive and negative electrodes such that the density of the positive and negative electrodes of the IDT 93 is gradually increased toward the IDT 94, as shown in FIG. 9(b), the frequency characteristic curve becomes as indicated by a solid line 91 in FIG. 9(a). Inversely, when an up-chirp IDT 95 is placed adjacent to an IDT 96 having a pair of positive and negative electrodes such that the density of the positive and negative electrodes of the IDT 95 is gradually increased toward the IDT 96, as shown in FIG. 9(c), the frequency characteristic curve becomes as indicated by a broken line 92 in FIG. 9(a). The frequency characteristics indicated by the broken line 92 are better than those indicated by the solid line 91. Thus, it is apparent that the IDT 93 has directivity indicated by an arrow 93D and the IDT 95 has directivity indicated by an arrow 95D.

The directivity of a chirp transducer was examined under various conditions as described above. It was found that when $Zm/Zg < 1$, the chirp transducer had directivity in which the density of the positive and negative electrodes was increased; when $Zm/Zg = 1$, the chirp transducer did not have directivity; and when $Zm/Zg > 1$, the chirp transducer had directivity in which the density of the positive and negative electrodes was decreased. Hence, when a filter is constituted by considering this directivity of the transducer, the filter can have a low insertion loss and a wide band width.

Figure 6:
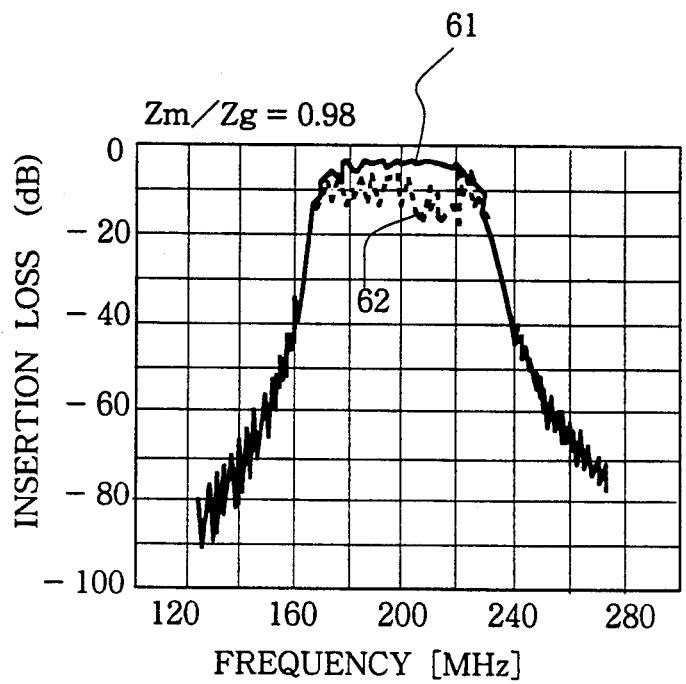
FIG. 6(a) shows the frequency characteristics of a chirp filter of $Zm/Zg=0.98$ for explaining the directivity thereof.
FIGS. 6(b) and 6(c) show the arrangements of the electrodes thereof.
Figure 6:
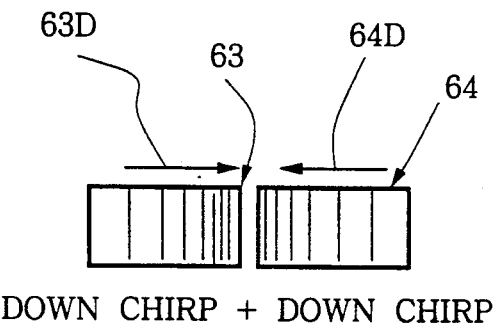
Figure 6:
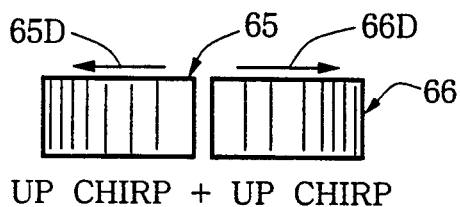

FIG. 6(a) shows the frequency characteristics of a chirp transducer for explaining the directivity thereof by way of analysis of an equivalent circuit when the thickness of each aluminum electrode is set to 2,000 angstrom and Zm/Zg=0.98, and FIGS. 9(b) and 9(c) show the arrangements of the electrodes thereof. In other words, FIGS. 9(a), 9(b), and 9(c) show the frequency characteristics and the like when a filter is constituted with the transducers being used in the example shown in FIGS. 7(a), 7(b), and 7(c). When down-chirp IDTs 63 and 64 are placed adjacent to each other as shown in FIG. 6(b), the frequency characteristic curve becomes as indicated by a solid line 61 in FIG. 6(a). Inversely, when up-chirp IDTs 65 and 66 are placed adjacent to each other as shown in FIG. 6(c), the frequency characteristic curve becomes as indicated by a broken line 62 in FIG. 6(a). This difference in frequency characteristics is due to the directivities of the IDTs 63, 64, 65, and 66 indicated by arrows 63D, 64D, 65D, and 66D.

Figure 10:
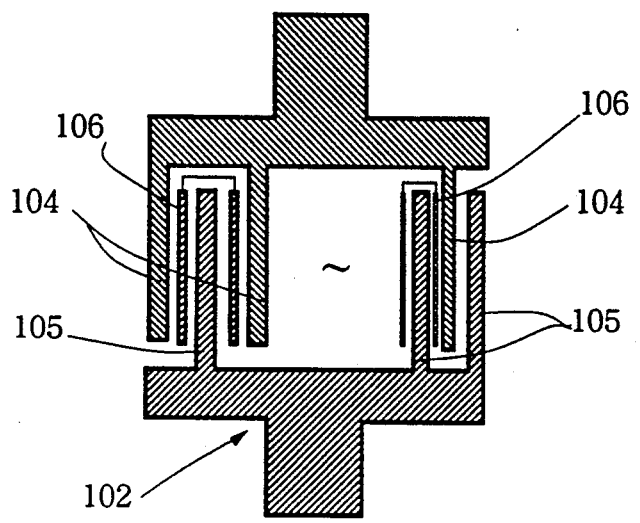
FIG. 10 is a plan view showing a transducer using floating electrodes.

Particularly, according to a method, Zm/Zg can be adjusted by providing floating electrodes, as shown in FIG. 10, thus imparting directivity to the transducer. Referring to FIG. 10, a transducer 102 as a surface acoustic wave transducer has positive and negative electrodes 104 and 105, and floating electrodes 106 each in the gap between the corresponding positive and negative electrodes 104 and 105. Every other floating electrodes 106 are interconnected. With the interconnected floating electrodes 106, Zm/Zg of the transducer 102 becomes smaller than 1. Although not shown, when open floating electrodes 106 which are not interconnected are provided, Zm/Zg of the transducer 102 becomes larger than 1.

Figure 11:
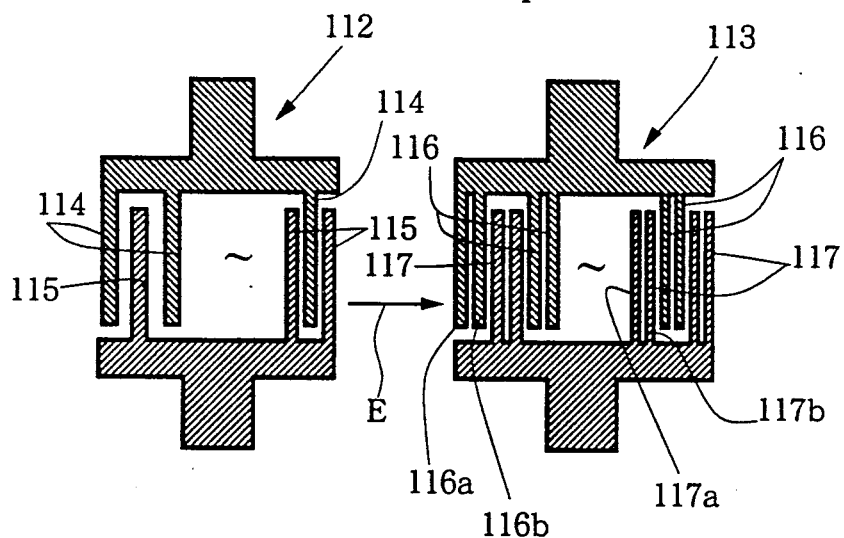
FIG. 11 is a plan view showing a filter using a double electrode structure.

In FIG. 2, an example has been described in which the excitation-side electrodes 24 and 25 are set to satisfy m/p=0.5 and the reception-side electrodes 26 and 27 are set to satisfy m/p=0.8. In contrast to this, when the excitation-side electrodes are set to satisfy m/p=0.5 while the reception-side electrodes form a double electrode structure, the filter characteristics are further improved. FIG. 11 shows a filter having this double electrode structure. Referring to FIG. 11, an excitation-side surface acoustic wave transducer 112 is arranged on a piezoelectric substrate, and a reception-side surface acoustic wave transducer 113 is arranged on the piezoelectric substrate. The excitation-side surface acoustic wave transducer 112 has positive and negative electrodes 114 and 115. These electrodes satisfy m/p=0.5. The reception-side surface acoustic wave transducer 113 has positive and negative electrodes 116 and 117. The reception-side surface acoustic wave transducer 113 has a double electrode structure. In other words, the filter shown in FIG. 11 is obtained by using the electrodes 24 and 25 of the filter of FIG. 2 unchanged and splitting each of the electrodes 26 and 27 of the filter of FIG. 2 into halves to constitute the electrodes 116 (116a, 116b) and 117 (117a, 117b) each having a double electrode structure. In this case, the electrode having the double electrode structure satisfies m/p=0.25.

Since the double electrode structure has bi-directional characteristics, the total characteristics are better than those of a structure shown in FIG. 2 in which m/p=0.8 is set to weaken the opposite directivity. Although the electrode width is λ/8, no problem arises in the manufacture when a practical frequency is employed.

In the above examples, a filter has been described as a surface acoustic wave element. However, the present invention can be similarly applied to a delay line. A surface acoustic wave transducer itself having uni-directional characteristics as described above can be used as an impedance element.

As has been described above, according to the present invention, in a surface acoustic wave element in which interdigital electrodes each having a thickness are provided on a piezoelectric or electrostrictive substrate, the electrodes are arranged such that an electrical signal caused by an excited and received surface acoustic wave and reflection of the surface acoustic wave reflected by the electrodes have the same phase in one direction and opposite phases in the other direction, thus providing uni-directional characteristics. Therefore, a surface acoustic wave element having a low insertion loss and a wide band width can be obtained.

What is claimed is:

1. A surface acoustic wave element wherein a first surface acoustic wave transducer for exciting a surface acoustic wave and a second surface acoustic wave transducer for receiving the surface acoustic wave are provided on a piezoelectric or electrostrictive substrate in a manner where said transducers are opposed to each other in the propagation direction of the surface acoustic wave and wherein:

the first surface acoustic wave transducer comprises a first interdigital electrode constituted by positive and negative electrodes alternately arranged in a manner whereby the electrode width and the period thereof are gradually decreased in the direction of propagation of the surface acoustic wave;

the second surface acoustic wave transducer comprises a second interdigital electrode constituted by positive and negative electrodes alternately arranged in a manner whereby the electrode width and the period thereof are gradually increased in the direction of propagation of the surface acoustic wave;

Zm/Zg of each of said first and second surface acoustic wave transducers is smaller than 1 wherein Zm is the acoustic impedance of a metal film constituting the positive and negative electrodes and Zg is the acoustic impedance of an electrode gap between the positive and negative electrodes.

2. The surface acoustic wave element according to claim 1 wherein the thickness of said electrodes is $0.01 \leq H/\lambda \leq 0.10$ wherein H is the thickness of the electrodes and $\lambda$ is the wavelength of the surface acoustic wave.

3. The surface acoustic wave element according to claim 1 wherein said first and second surface acoustic wave transducers satisfy $0.2 \leq m/p \leq 0.7$ wherein m is the electrode width and p is the period of said positive and negative electrodes.

4. A surface acoustic wave element wherein a first surface acoustic wave transducer for exciting a surface acoustic wave and a second surface acoustic wave transducer for receiving the surface acoustic wave are provided on a piezoelectric or electrostrictive substrate in a manner whereby the transducers are opposed to each other in the propagation direction of the surface acoustic wave and wherein the first surface acoustic wave transducer comprises a first interdigital electrode constituted by positive and negative electrodes alternately arranged in a manner whereby the electrode width and the period thereof are gradually decreased in a direction of propagation of the surface acoustic wave; and the second surface acoustic wave transducer comprises a second interdigital electrode constituted by positive and negative electrodes alternately arranged in a manner whereby the electrode width and the period thereof are gradually decreased in the direction of propagation of the surface acoustic wave.

5. A surface acoustic wave element according to claim 4, wherein the ratio $Zm/Zg$ of said first surface acoustic wave transducer is smaller than 1 and $Zm/Zg$ of said second surface acoustic wave transducer is larger than 1 wherein $Zm$ is the acoustic impedance of a metal film constituting the positive and negative electrodes and $Zg$ is the acoustic impedance of an electrode gap between said positive and negative electrodes.

6. The surface acoustic wave element according to claim 5 wherein said first and second surface acoustic wave transducers satisfy $0.2 \leq m/p \leq 0.7$ where m is the electrode width and p is the period of said positive and negative electrodes.

7. The surface acoustic wave element according to claim 4 wherein said first interdigital electrode has a double electrode structure.

8. A surface acoustic wave element according to claim 4 wherein the thickness of the electrodes is $0.01 \leq H/\lambda \leq 0.10$ wherein H is the thickness of the electrodes and is the wavelength of the surface acoustic wave.

9. A surface acoustic wave element according to claim 4 wherein $Zm/Zg$ of each of said first and second surface acoustic wave transducers is smaller than 1 wherein $Zm$ is an acoustic impedance of a metal film constituting the positive and negative electrodes and $Zg$ is an acoustic impedance of an electrode gap between the positive and negative electrodes.

10. The surface acoustic wave element according to claim 9 wherein said first surface acoustic wave transducer satisfies $0.2 \leq m/p \leq 0.7$ and said second surface acoustic wave transducer satisfies $0.72 \leq m/p \leq 0.9$ wherein m is the electrode width and p is the period of said positive and negative electrodes.

11. A surface acoustic wave element wherein a first surface acoustic wave transducer for exciting a surface acoustic wave and a second surface acoustic wave transducer for receiving the surface acoustic wave are provided on a piezoelectric or electrostrictive substrate in a manner whereby the transducers are opposed to each other in the propagation direction of the surface acoustic wave and wherein said first surface acoustic wave transducer comprises a first interdigital electrode constituted by positive and negative electrodes alternately arranged in a manner whereby the electrode width and the period thereof are gradually increased in the direction of propagation of the surface acoustic wave;

said second surface acoustic wave transducer comprises a second interdigital electrode constituted by positive and negative electrodes alternately arranged in a manner whereby the electrode width and the period thereof are gradually decreased in the direction of propagation of the surface acoustic wave; and $Zm/Zg$ of each of the said first and second surface acoustic wave transducers is larger than 1 wherein $Zm$ is an acoustic impedance of a metal film constituting said positive and negative electrodes and $Zg$ is the acoustic impedance of an electrode gap between said positive and negative electrodes.

12. A surface acoustic wave element according to claim 11 wherein the thickness of the electrodes is $0.01 \leq H/\lambda = 0.10$ wherein H is the thickness of the electrodes and $\lambda$ is the wavelength of the surface acoustic wave.

13. A surface acoustic wave element according to claim 11 wherein said first and second surface acoustic wave transducers satisfy $0.2 \leq m/p \leq 0.7$ wherein m is the electrode width and p is the period of said positive and negative electrodes.

14. A surface acoustic wave element wherein a first surface acoustic wave transducer for exciting a surface acoustic wave and a second surface acoustic wave transducer for receiving the surface acoustic wave are provided on a piezoelectric or electrostrictive substrate in a manner whereby the transducers are opposed to each other in the propagation direction of the surface acoustic wave and wherein said first surface acoustic wave transducer comprises a first interdigital electrode constituted by positive and negative electrodes alternately arranged in a manner whereby the electrode width and the period thereof are gradually increased in the direction of propagation of the surface acoustic wave; and said second surface acoustic wave transducer comprises a second interdigital electrode constituted by positive and negative electrodes alternately arranged in a manner whereby the electrode width and the period thereof are gradually increased in the direction of propagation of the surface acoustic wave.

15. A surface acoustic wave element according to claim 14 wherein the thickness of the electrodes is $0.01 \leq H/\lambda \leq 0.10$ wherein H is the thickness of the electrodes and is the wavelength of the surface acoustic wave.

16. The surface acoustic wave element according to claim 14 wherein $Zm/Zg$ of each of said first and second surface acoustic wave transducers is larger than 1 whereby $Zm$ is the acoustic impedance of a metal film constituting said positive and negative electrodes and $Zg$ is the acoustic impedance of an electrode gap between said positive and negative electrodes.

17. The surface acoustic wave element according to claim 14 wherein $Zm/Zg$ of said first surface acoustic wave transducer is larger than 1 and $Zm/Zg$ of said second surface acoustic wave transducer is smaller than 1 wherein $Zm$ is the acoustic impedance of a metal film constituting said positive and negative electrodes and $Zg$ is the acoustic impedance of an electrode gap between said positive and negative electrodes.

18. The surface acoustic wave element according to claim 17, wherein said first and second surface acoustic wave transducers satisfy $0.2 \leq m/p \leq 0.7$ wherein m is the electrode width and p is the period of said positive and negative electrodes.

19. The surface acoustic wave element according to claim 16 wherein said first surface acoustic wave transducer satisfies $0.2 \leq m/p \leq 0.7$ and said second surface acoustic wave transducer satisfies $0.72 \leq m/p \leq 0.9$ wherein m is the electrode width and p is the period of said positive and negative electrodes.

* * * * *